United States Patent
McKee et al.

(10) Patent No.: US 6,657,159 B2
(45) Date of Patent: Dec. 2, 2003

(54) METHOD FOR LASER DRILLING

(75) Inventors: Terry McKee, Nepean (CA); Joseph Lobin, Kanata (CA)

(73) Assignee: GSI Lumonics, Inc., Ontario (CA)

(*) Notice: Subject to any disclaimer, the term of this patent is extended or adjusted under 35 U.S.C. 154(b) by 0 days.

(21) Appl. No.: 10/163,799

(22) Filed: Jun. 6, 2002

(65) Prior Publication Data

US 2003/0047545 A1 Mar. 13, 2003

Related U.S. Application Data

(62) Division of application No. 09/546,681, filed on Apr. 11, 2000, now abandoned.

(51) Int. Cl.$^7$ .............................................. B23K 26/38
(52) U.S. Cl. ................................................ 219/121.71
(58) Field of Search .................... 219/121.71, 121.6, 219/121.67, 121.7, 121.84, 121.78, 121.8, 121.69, 121.85; 264/400; 427/97, 555, 554; 216/17, 65

(56) References Cited

U.S. PATENT DOCUMENTS

| | | | |
|---|---|---|---|
| 4,839,497 A | | 6/1989 | Sankar et al. |
| 5,222,617 A | | 6/1993 | Gregory et al. |
| 5,536,579 A | * | 7/1996 | Davis et al. ................ 428/421 |
| 5,593,606 A | | 1/1997 | Owen et al. |
| 5,744,780 A | | 4/1998 | Chang et al. |
| 5,837,964 A | | 11/1998 | Emer et al. |
| 5,841,066 A | | 11/1998 | Bocherens |
| 5,841,099 A | | 11/1998 | Owen et al. |
| 5,910,255 A | | 6/1999 | Noddin |

FOREIGN PATENT DOCUMENTS

| | | |
|---|---|---|
| DE | 197 19 700 A1 | 11/1998 |
| EP | 0 299 702 A1 | 1/1989 |

OTHER PUBLICATIONS

M. Owen, E. Roelants and J. Van Puymbroeck, "Laser drilling of blind holes in FR4/glass", Circuit World 24/1 (1997), pp. 45–49.

* cited by examiner

*Primary Examiner*—Tom Dunn
*Assistant Examiner*—Jonathan Johnson
(74) *Attorney, Agent, or Firm*—John A. Merecki; Hoffman, Warnick & D'Alessandro

(57) ABSTRACT

Drilling holes in structures using two different lasers allows a precise hole to be formed quickly. While one laser cuts a hole quickly, a second laser precisely shapes the hole. One useful application of such a method is drilling holes in multilayered structures such as Printed Wiring Boards (PWBs). One laser can precisely remove a first layer (copper) and a portion of a second layer (dielectric material). During this removal the shape of the hole is precisely formed. A second laser can remove the remaining portion of the second layer, exposing a third layer (copper). The use of the second laser can allow rapid removal of the remaining portion of the second layer. When cutting through a PWB, the second laser can be of a type that minimally damages the third copper layer.

19 Claims, 4 Drawing Sheets

METHOD FOR LASER DRILLING

CROSS-REFERENCE TO RELATED APPLICATIONS

This application is a divisional of U.S. patent application Ser. No. 09/546,681 now abandoned, filed Apr. 11, 2000.

FIELD OF THE INVENTION

The present invention is directed towards a method and system for laser drilling in structures, such as creating vias.

BACKGROUND OF THE INVENTION

Drilling precise holes or vias in structures, especially in multilayered structures such as printed wiring boards (PWB), can be difficult to do in a controlled and rapid manner. While a CO2 laser may quickly make incisions in a structure, it cannot do so precisely. A solid state laser, on the other hand, can precisely cut a hole but it does so at the expense of speed.

The dilemma of speed versus precision is especially prominent when drilling vias in PWBs. A PWB typically has a top copper layer, a second dielectric layer, an underlying copper layer and more layers of similar construction. Vias can be through vias which go right through the board; blind vias which go through one copper and one dielectric layer, stopping at the underlying copper layer; or step vias which go through more than one pair of copper/dielectric layers, ultimately stopping at a copper layer. Blind vias in PWBs must be cut only through the top copper and dielectric layers and must not affect the underlying layer. The sides of the via must be perfectly straight and smooth, without interference from the residue of dielectric fillers.

One prior art technique used to drill vias in multilayered materials, particularly PWBs, used a solid state laser to drill through the first two layers (copper and dielectric), stopping at the underlying layer (copper), forming a blind via. This technique is discussed in U.S. Pat. Nos. 5,593,606 (Owen et al. 1) titled "Ultraviolet laser system and method for forming vias in multi-layered targets" issued on Jan. 14, 1997 and 5,841,066 (Owen et al. 2) titled "Method employing UV laser pulses of varied energy density to form depthwise self-limiting blind vias in multi-layered targets" issued on Nov. 24, 1998. A small beam from the laser was trepanned to create a via of a larger size whose shape could be manipulated by changing the trepanning motion parameters. Owen et al. 1 and 2 specifies the use of a solid state laser to precisely and completely remove all the material from at least two layers of the PWB. However, by using a solid state laser with a trepanning motion, the laser will damage the underlying copper layer unless the machining power is reduced before it arrives there. This is not possible for some dielectric materials, such as FR4, that contain non-uniform glass fillers requiring high machining power to remove. Further, the precision of this process slows down the drilling process.

Another technique uses a solid state laser to drill through the copper using trepanning and a CO2 laser to drill through the dielectric using percussion. The wavelength of the CO2 laser is reflected by copper so the underlying copper layer is not damaged, creating a self-limiting process. This technique is discussed in German patent application DE 19719700-A1 (Roelants) titled "Blind hole production in circuit board" issued on Nov. 12, 1998. When this process is used on RCC (resin coated composition) dielectric, the walls of the via can be undercut (i.e. a meniscus shape) rather than the positive taper preferred in the chemical plating process. Also, when the process is used on FR4 dielectric the glass filler material can remain along the walls. The problems in arise from the percussion method used for the entire dielectric material which lacks the precision of the trepanning motion. Roelants specifies the removal of the residual dielectric material by the use of a chemical solution.

U.S. Pat. No. 5,910,255 (Noddin), titled "Method of sequential laser processing to efficiently manufacture modules requiring large volumetric density material removal for micro-via formation" issued on Jun. 8, 1999, describes drilling vias with a first laser and a first trepanning motion, followed by a second laser and a second trepanning motion. This involves drilling the via twice with two different lasers and trepanning motions. Cutting the via a second time smoothes the edges of the via formed by the first laser and trepanning motion. However, re-drilling the via is time costly.

SUMMARY OF THE INVENTION

It is an object of the present invention to improve the process of laser drilling in a structure to form vias, slots and the like.

It is an object of the present invention to provide a method of laser drilling for creating vias in a multilayered structure that forms precisely shaped sides of the vias.

It is an object of the present invention to provide a method of laser drilling for creating vias in a PWB that produces smooth and precise sides of the vias for a variety of dielectric materials in the PWB.

In accordance with one aspect of the present invention there is provided a method of drilling vias in a multilayered structure having at least three layers, the method using a first laser and a second laser, said method comprising the steps of: (a) removing a first layer of the multilayered structure with the first laser; (b) removing a portion of a second layer of the multilayered structure with the first laser; and (c) removing the remaining portion of the second layer using the second laser.

In accordance with another aspect of the present invention there is provided a system for drilling vias in a multilayered structure having at least three layers, said system comprising: a first laser configurable for removing a first layer of the multilayered structure and a portion of a second layer of the multilayered structure; and a second laser configurable for removing the remaining portion of the second layer.

DETAILED DESCRIPTION

Figure 1:
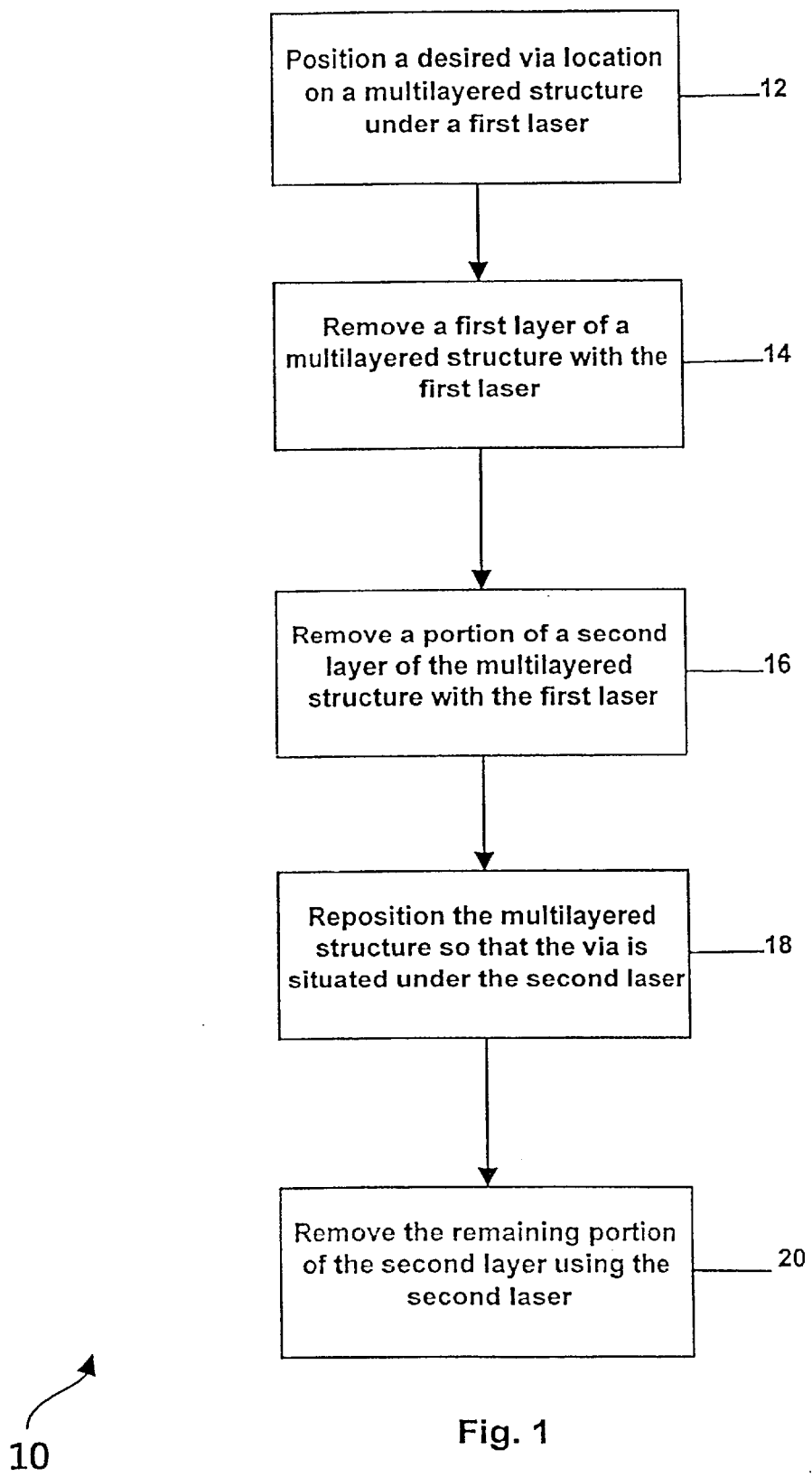
FIG. 1 shows a flow diagram for drilling a blind via using 2 different lasers according to an embodiment of the present invention.

In the present description the term via is used to describe traditional blind vias, through vias, etches, cutting and scribing in a structure. FIG. 1 illustrates a method 10 of drilling a blind via using 2 different lasers according to an embodiment of the present invention. A multilayered structure, in this example a PWB, is positioned such that a desired via location is situated under a first laser 12. The first laser is used to drill though the outside copper layer 14 and partially through the underlying dielectric layer 16 without exposing the underlying copper layer.

In the preferred embodiment, the first laser is a solid state laser that drills through these layers 14 and 16 in trepanning motion. A solid state laser has low pulse energy (e.g. 0.5 mJ); however, to cut through the top copper layer high energy density is required. To achieve this the laser beam from the solid state laser is focused into a smaller beam with higher energy density. Due to the smaller size of the laser beam (approximately 20 $\mu$m) trepanning motion must be used for most vias. Any via smaller than 20 $\mu$m may use percussion motion.

Figure 3:
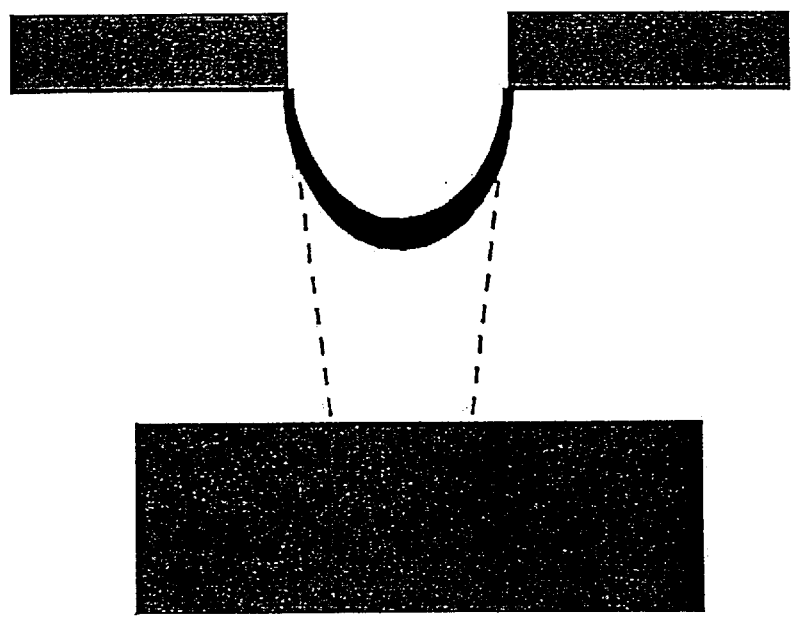
FIG. 3a and b shows an illustration of exemplary results of the via after drilling with the first laser according to an embodiment of the present invention.
Figure 3:
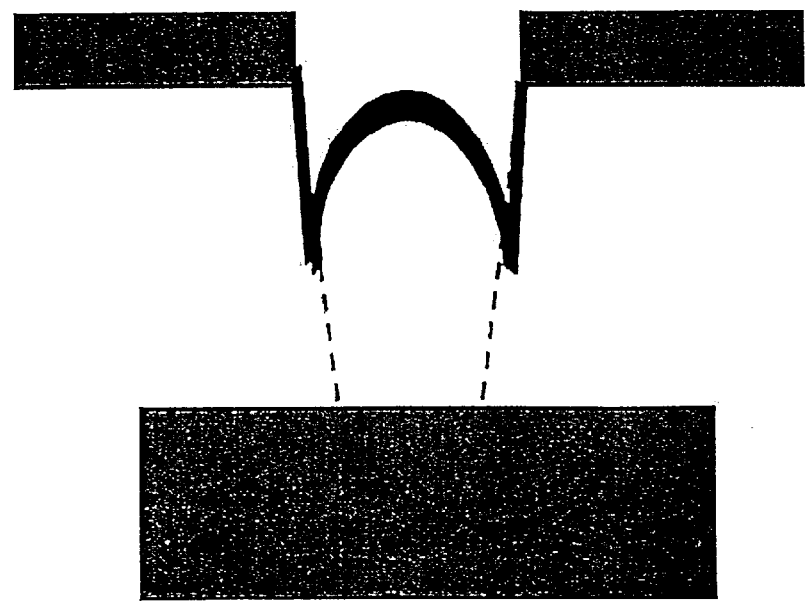

In the trepanning technique a laser beam spot starts in the center of the desired via and gradually spirals outwards towards the outer edge of the via. Once the outer edge has been reached the laser beam orbits around the via as is necessary for the via after which the beam spirals back to the center. The trepanning technique is advantageous in that the trepanning parameters can be chosen to optimize the shape of the cut. For example, one may choose to dig more deeply in the center of the via but not to penetrate as deeply along the sides as is shown in FIG. 3a. Although a laser in percussion mode can perform this task in less time, it does not allow the same flexibility since the beam profile is fixed and each pulse simply removes a certain amount of material across the whole via. FIG. 3a is designed to reduce undercut from subsequent drilling of layer two by a second laser. FIG. 3b is designed to facilitate clean removal of dielectric material filler, such as glass, from the walls after subsequent drilling of layer two by the second laser.

The multilayered structure is moved 18 such that the via's position is moved from under the first laser to under a second laser.

The second infrared laser is used to quickly and completely remove the remaining dielectric layer 20 and expose the underlying copper layer without penetrating the copper. In the preferred embodiment the second laser is a CO2 laser that drills through the remaining dielectric material using percussion. CO2 lasers have a high pulse energy but their wavelength is reflected by copper, thus they cannot penetrate copper. Due to the high pulse energy of CO2 lasers there is no need to focus the beam to create a higher energy density beam. Accordingly, the larger size beam profile can be used in a percussion mode to quickly remove material.

Figure 2:
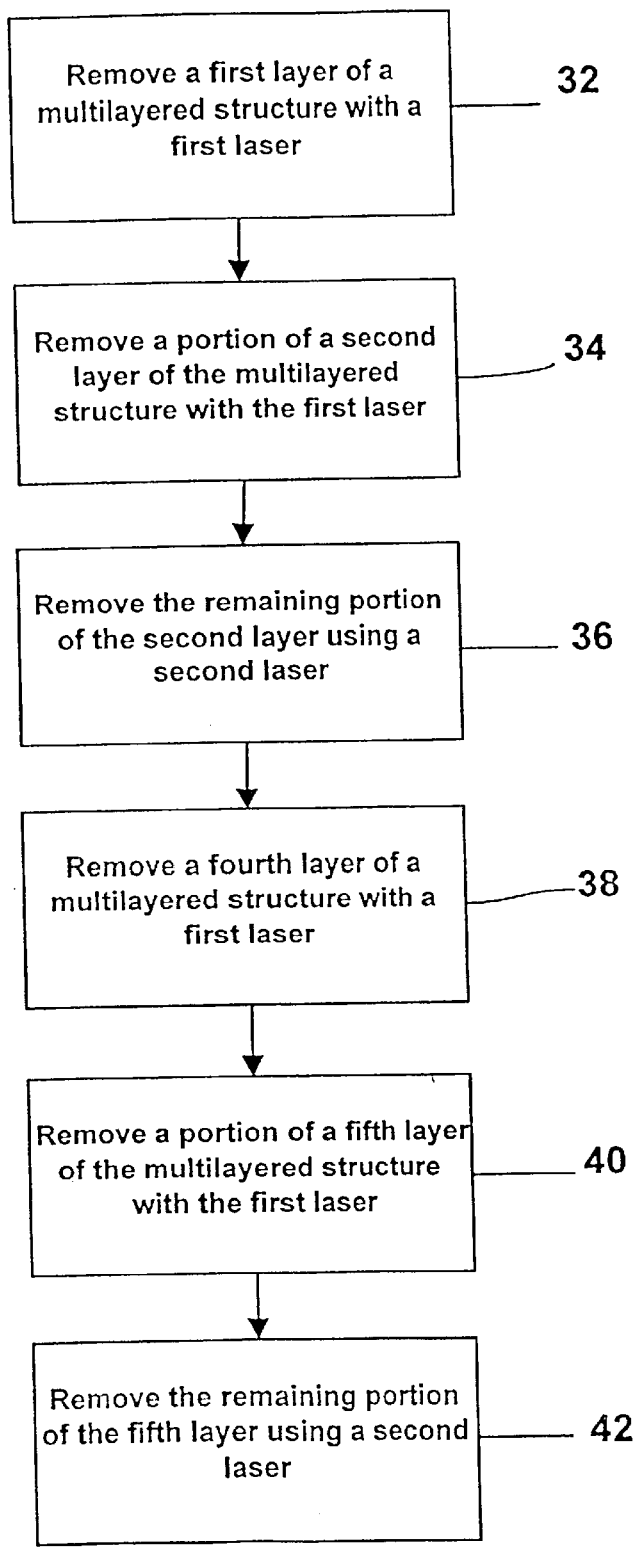
FIG. 2 shows a flow diagram for drilling a step via using 2 different lasers according to an embodiment of the present invention.

FIG. 2 illustrates a method 30 of drilling a step via where there is more than one copper/dielectric pair to drill through according to an embodiment of the present invention. A first solid state laser drills through the top copper layer 32 and partially into the second dielectric layer 34 using trepanning. Then, a second CO2 laser removes the remaining dielectric 36 self-stopping at the underlying copper layer (third) without damaging the third layer. The first solid state laser drills through the center portion of the via 38 at the underlying copper layer and partially into the fourth dielectric layer 40. The second CO2 laser removes the remaining dielectric 42 self-stopping at the second underlying copper layer (fifth) without damaging the fifth layer. The process can be repeated for subsequent layers if desired.

The process in FIG. 2 is a repetition of the process in FIG. 1 repeated twice. Since it is the same process repeated, the process becomes easily reproducible as with each reiteration the process stops at a copper layer.

The method in FIG. 2 can be adapted to drill a through via. A first solid state laser can drill fully through a multilayered board but it is significantly slower when drilling through the dielectric portions of the multilayered structure than the second CO2 laser would be. Therefore, a two laser process is faster. However, the second CO2 laser may cause undercut or other problems. Therefore, the method involved in the present invention can be used to drill through holes quickly and precisely.

While the method of drilling holes in multilayered structures using two lasers has been described with regards to drilling vias in PWBs, the process is not limited to this application. For example, the use of two lasers can be used to process holes, such as scribing, cutting or etching, in any multilayered structure. A first laser would be used to rapidly make incisions into the multilayered structure while the second laser would be used to more precisely form the indentation.

Figure 4:
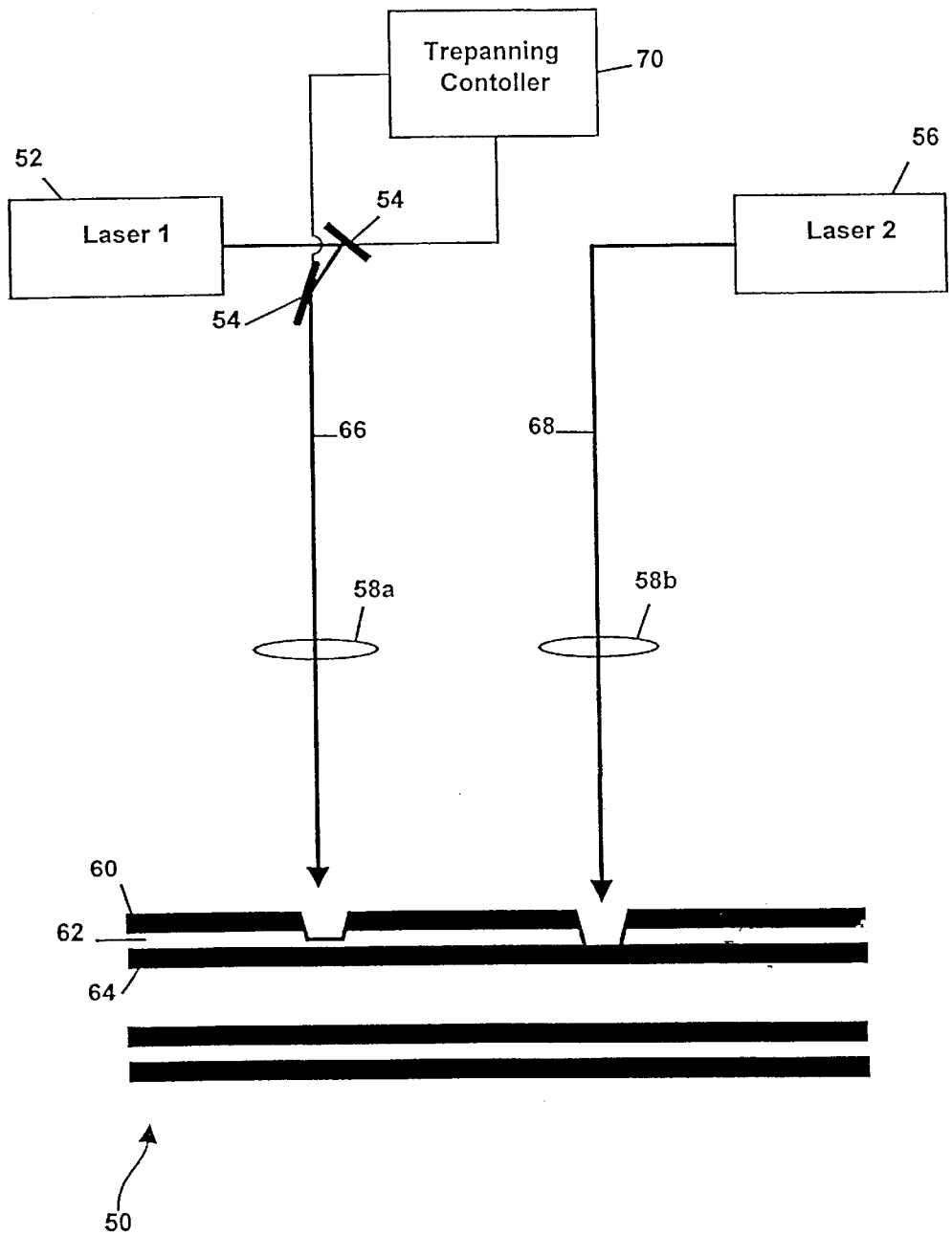
FIG. 4 shows a laser drilling system according to an embodiment of the present invention.

FIG. 4 shows an embodiment of a laser drilling system 50 according to the present invention. The first laser 52 uses a trepanning motion to drill a via. The trepanning motion is controlled by a trepanning controller 70 that controls the motion of mirrors 54 which reflect a laser beam 66 through a lens 58a. The lens 58a focuses the laser beam 66 before the beam 66 drills through a top layer 60 and partially through a second layer 62.

When the first laser 52 is finished the PWB is moved to position the partially cut via under a laser beam 68 coming from a second laser 56 through a lens 58b. The laser beam 68 removes the remaining second layer 62, stopping at the third layer 64 without harming that layer 64.

What is claimed is:

1. A method for drilling vias in a multilayered structure comprising a first conductive layer and an underlying dielectric layer, comprising:

removing the first conductive layer of the multilayered structure using a first laser, the first laser being configured to emit a first energy beam at a first wavelength and to focus the first energy beam to a first spot for removing the first conductive layer, the first spot having a first diameter which is less than a diameter of a via hole to be drilled;

removing the underlying dielectric layer of the multilayered structure using a second laser, the second laser being configured to emit a second energy beam at a second wavelength and to focus the second energy beam to a second spot having a second diameter which is equal to or greater than the diameter of the via hole to be drilled; and, directing the first spot in a trepanning motion for completely removing the first conductive layer of the multilayered structure to the diameter of the via hole to be drilled, and for removing a portion of the underlying dielectric layer.

2. The method of claim 1 wherein the first laser is a solid state laser.

3. The method of claim 1 wherein the second laser is a CO2 laser.

4. The method of claim 1 further comprising:

removing the remaining portion of the underlying dielectric layer using the second laser by removing a portion of the dielectric layer across the entire diameter of the via hole in a pulsed manner.

5. The method of claim 1 wherein the multilayer structure further includes a second conductive layer underlying the dielectric layer and wherein the second laser has a wavelength that is substantially reflected by the second conductive layer.

6. The method of claim 5 further comprising:
completely removing the remaining portion of the dielectric layer using the second laser to expose the second conductive layer without penetrating the second conductive layer.

7. The method of claim 1 wherein the energy of the second energy beam is greater than the energy of the first energy beam.

8. The method of claim 1 wherein the second wavelength is substantially reflected by the first conductive layer.

9. The method of claim 8 wherein the second wavelength is an infrared wavelength.

10. The method of claim 1 wherein the first conductive layer comprises copper and wherein the second wavelength comprises an infrared wavelength.

11. A method for forming a via in a multi-layered structure comprising a first layer have a first physical characteristic and an underlying second layer having a second different physical characteristic, comprising:

emitting a first laser beam at a first wavelength using a first laser;

focusing the first laser beam to a first spot diameter using a first lens assembly, the first spot diameter being smaller than a diameter of the via to be drilled;

directing the first laser beam through the first lens assembly in a controlled manner using a mirror assembly;

controlling movement of the mirror assembly such that the first laser spot drills the via completely through the first layer of the multilayered structure and partially through the underlying second layer of the multilayered structure;

optimizing a shape of the via drilled through the first layer and partially through the underlying second layer of the multi-layered structure;

emitting a second laser beam at a second wavelength using a second laser;

focusing the second laser beam to a second spot diameter using a second lens assembly, the second wavelength and the second spot diameter being selected to provide a pulse energy for removing the underlying second layer of the multi-layered structure; and, supporting the multi-layer structure during the formation of the via and for moving the multi-layer structure to position the via under one of the first laser or the second laser.

12. The method according to claim 11 wherein the multi-layered structure further includes a third layer underlying the second layer and wherein the via is a blind via to be made only in the first and the second layers without damaging the third layer and wherein the second wavelength is selected to be reflected by the third layer.

13. The method according to claim 12 wherein the first and the third layers comprise conductive materials and the second layer comprises a dielectric material and wherein the blind via has a diameter substantially equal to the second spot diameter.

14. The method according to claim 11 further comprising:
moving the first laser spot in a trepanning motion.

15. The method according to claim 11 further comprising:
moving the first laser spot in a pattern for shaping the via in the second layer.

16. The method according to claim 15 wherein the via is shaped by removing more of the second layer near a center of the via than at the sides of the via.

17. The method according to claim 15 wherein the via is shaped by removing more of the second layer near the sides of the via than at a center of the via.

18. The method according to claim 11 wherein the first layer comprises copper and the second layer comprises a dielectric and wherein the diameter of the via is substantially equal to the second spot diameter.

19. The method according to claim 7 wherein the second wavelength is an infrared wavelength.

* * * * *